United States Patent
Sekiya et al.

(10) Patent No.: US 7,288,467 B2
(45) Date of Patent: Oct. 30, 2007

(54) WAFER PROCESSING METHOD

(75) Inventors: Kazuma Sekiya, Tokyo (JP); Takashi Ono, Tokyo (JP)

(73) Assignee: Disco Corporation, Tokyo (JP)

( * ) Notice: Subject to any disclaimer, the term of this patent is extended or adjusted under 35 U.S.C. 154(b) by 227 days.

(21) Appl. No.: 11/262,770

(22) Filed: Nov. 1, 2005

(65) Prior Publication Data

US 2006/0094209 A1    May 4, 2006

(30) Foreign Application Priority Data

Nov. 1, 2004    (JP)    ............................. 2004-317751

(51) Int. Cl.
*H01L 21/78* (2006.01)
*H01L 21/48* (2006.01)

(52) U.S. Cl. ...................... 438/465; 438/113

(58) Field of Classification Search ................ 438/113, 438/458, 460–465, 691, 704, 734, 750; 257/622, 257/723, E23.001–E23.194
See application file for complete search history.

(56) References Cited

U.S. PATENT DOCUMENTS 4,871,651 A * 10/1989 McCune et al. ............ 430/315
5,368,783 A * 11/1994 Kobayashi et al. ......... 252/600
5,858,106 A *  1/1999 Ohmi et al. ................... 134/1
2006/0105273 A1*  5/2006 Fukuda et al. .............. 430/313

FOREIGN PATENT DOCUMENTS

JP    2004-228133    8/2004

* cited by examiner

*Primary Examiner*—Calvin Lee
(74) *Attorney, Agent, or Firm*—Wenderoth, Lind & Ponack, L.L.P.

(57) ABSTRACT

To divide into individual devices efficiently in dicing a wafer without causing quality of the devices to lower, a wafer processing method includes steps of coating a rear surface of the wafer with a resist film, exposing and sensitizing portions of the resist film other than regions corresponding to the streets; and supplying a silylation agent onto a surface of the resist film and silylating the resist film in a sensitized region. In an etching unit, an oxygen- or chlorine-containing gas is plasmatized and supplied to a rear surface of the wafer coated with a silylated resist film, and the resist film in an unsilylated regions corresponding to the streets is ashed and removed. A stable fluoride gas is plasmatized and supplied to the rear surface of the wafer, and the resist film in the regions corresponding to the streets is etch-removed to divide the wafer W into individual devices.

5 Claims, 6 Drawing Sheets

WAFER PROCESSING METHOD

BACKGROUND OF THE INVENTION

1. Field of the Invention

The present invention relates to a method of processing a wafer and dividing the resultant wafer into individual devices.

2. Related Art

A wafer a plurality of devices are formed on the front surface which are partitioned by streets, is ground at a rear surface thereof into a predetermined thickness and then diced by cutting along the streets to divide the wafer into individual devices, which are utilized for various kinds of electronic machines (refer to JP-A-2004-228133, for example).

However, a cutting blade rotating at a high speed cuts into the streets of the wafer for dicing, and the devices is likely to be chipped due to a breaking force of the blade, and consequently the die strength of the devices constituting the wafer lowers to cause the quality of the device to decrease. Especially, it has been demanded to set thickness of the wafer extremely small, i.e. to not larger than 100 µm, or not larger than 50 µm in recent years, and accordingly the mentioned strength of the devices has become an important problem.

In a dicing operation, it is necessary to align the blade with each street accurately and then cutting the streets one by one, so that the efficiency of the cutting operation becomes low. Especially, when the sizes of the devices are small with the number of the streets to be cut is large, cutting all the streets takes a considerably much time. This causes the productivity of the devices to be greatly reduced.

Therefore, an object to be solved by the present invention is to enable a wafer to be divided into individual devices efficiently in dicing a wafer without causing the quality of the devices to lower.

SUMMARY OF THE INVENTION

The present invention relates to a wafer processing method adapted to divide a wafer, which a plurality of devices are formed on the front surface defined by streets, into individual devices, including a resist film forming step adapted to coat a rear surface of the wafer with a resist film, and expose and sensitize portions of the resist film other than regions corresponding to the streets; a silylation step adapted to supply a silylation agent onto a surface of the resist film and silylate the resist film in a sensitized region; a street-corresponding resist film-removing step, which is carried out in an etching unit for plasmatizing a predetermined gas and carrying out an etching operation with the resultant gas, adapted to plasmatize an oxygen- or chlorine-containing gas and supply the resultant gas onto the rear surface of the wafer coated with the resist film silylated by the silylation step, and ash and remove the resist film in an unsilylated region corresponding to the streets; and a street-etching step adapted to plasmatize a stable fluoride gas and supplying the resultant gas onto the rear surface of the wafer, etch and remove the resist film in the region corresponding to the streets, and thereby divide the wafer into individual devices. In this method, the width of each region corresponding to each street may be equal to that of the street and may be smaller than the same.

Before the resist film forming step, a grinding step may be carried out, which is adapted to affix a protective member on the front surface of the wafer and grind the rear surface of the wafer so that the wafer has a predetermined thickness. Further, a resist film-removing step may be preferably carried out after the street-etching step, which is adapted to plasmatize an oxygen- or chlorine-containing gas, supply the resultant gas onto the rear surfaces of the devices, and ash and remove the resist film remaining on the rear surfaces of the devices. The stable fluoride gases used when the wafer is a silicon wafer include, for example, $SF_6$, $CF_4$, $C_2F_6$, $C_2F_4$, $CHF_3$, and the like.

According to the present invention, the portions of the resist film coated on the rear surface of the wafer other than regions corresponding to the streets are exposed and sensitized, and the sensitized region is silylated with a silylation agent supplied thereto. After the silylation operation is finished, the unsilylated region of the regist film corresponding to the streets is ashed and removed by using the etching unit, and the streets are then etched to divide the wafer into individual devices. Therefore, it is possible to remove of the region of the resist film corresponding to the streets and etch the streets in one etching unit, so that the wafer can be divided into individual devices efficiently. Since it is unnecessary to conduct cutting operation using the cutting blade, this method does not cause such disadvantages as chipping of the devices, a decrease in the die strength of the devices, and a decrease in the quality thereof. Moreover, since it is possible to separate all the streets from one another at once by the plasma etching operation, the method according to the invention is very efficient, and the productivity of the devices can be improved.

When the grinding operation is carried out before the resist film-forming step, the wafer can be formed to a predetermined thickness, so that the device can be formed to a predetermined thickness.

When the resist film-removing step is carried out after the street-etching step, it is possible to form a device any resist film is not remaining on the rear surface.

BRIEF DESCRIPTION OF THE DRAWING

FIGS. 5(A) to 5(D) are sectional views showing a series of steps according to the present invention, wherein FIG. 5(A) is a condition of the wafer coated a resist film on the rear surface thereof, FIG. 5(B) is a condition of the sensitized resist film to which a silylation agent is supplied; FIG. 5(C) is a condition of the resist film the surface is silylated; FIG. 5(D) is a condition of the resist film the upper portions corresponding to streets are removed.

DETAILED DESCRIPTION OF PREFERRED EMBODIMENT

Figure 1:
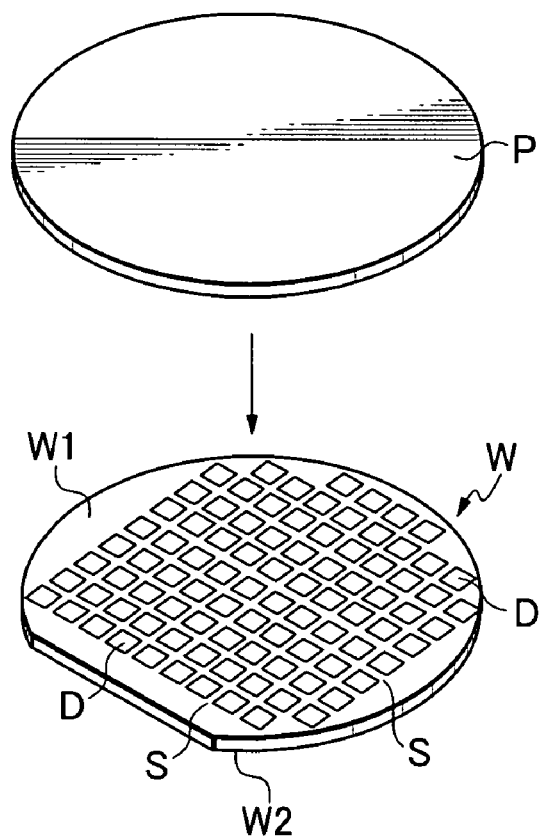
FIG. 1 is a perspective view showing a wafer and a protective member to be processed with a method of the present invention.

A plurality of devices D are formed on a front surface W1 of a wafer W shown in FIG. 1 which are partitioned by streets. The wafer W1 is, for example, a silicon wafer. First, a protective member P for protecting the devices D is affixed on the front surface W1 of the wafer W, as shown in FIG. 1. As the protective member P, it can be used a hard plate such as glass, polyethylene terephthalate, a ceramic material and the like, as well as an adhesive tape besides.

Figure 2:
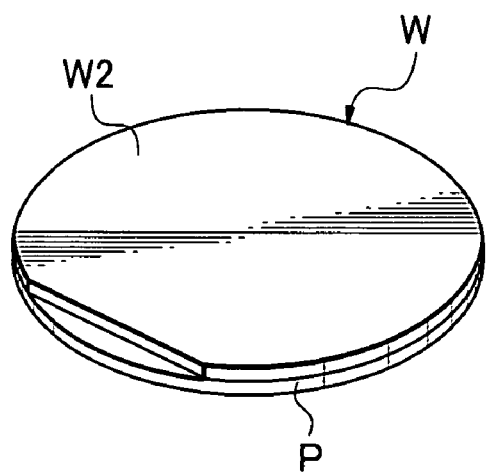
FIG. 2 is a perspective view showing a condition of the wafer affixed on the protective member.
Figure 3:
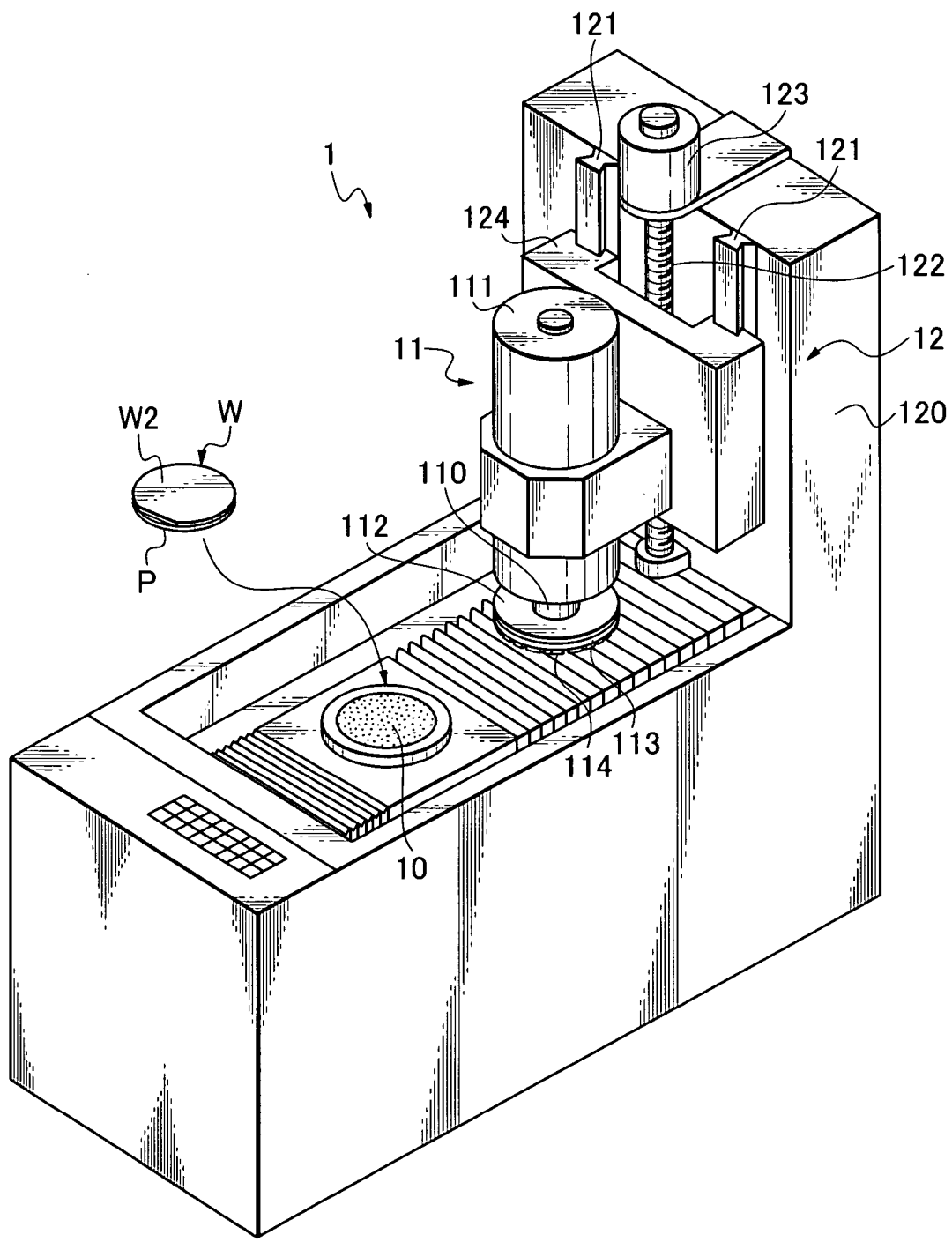
FIG. 3 is a perspective view showing an example of a grinding apparatus used for carrying out the method.

The rear surface W2 of the wafer W the protective member P is affixed on the front surface W1 is set so that the rear surface W2 is directed upward as shown in FIG. 2, and then the rear surface W2 is ground so that the wafer has a predetermined thickness (grinding step). In the grinding step, for example, a grinding apparatus 1 shown in FIG. 3 can be used. The grinding apparatus 1 includes a chuck table 10 for holding the wafer, a grinding unit 11 for grinding the wafer held on the chuck table 10, and a grinding unit feed device 12 for bringing the grinding unit dose to the chuck table 10 or separating the grinding unit from the chuck table 10.

The grinding unit 11 includes a spindle 110 having a vertical axis, a driving power source 111 for rotating the spindle 110, a grinding wheel 113 mounted fixedly on a lower portion of the spindle 110 via a wheel mount 112, and a grinding stone 114 fixed to a rear surface of the grinding wheel 113. The grinding stone 114 is rotated in accordance with the rotation of the spindle 110 driven by the driving power source 111.

The grinding unit feed device 12 includes a pair of guide rails 121 provided on a wall portion 120 and extending vertically, a ball screw 122 provided in parallel with the guide rails 121, a pulse motor 123 connected to one end of the ball screw 122, and a support portion 124 engaged slidably with the guide rails 121 and engaged at an inner nut with the ball screw 122. The support portion 124 is moved up and down in accordance with the turning of the ball screw 122 driven by the pulse motor 123. The grinding unit 11 supported on the support portion 124 is also moved up and down.

On the chuck table 10, the protective member P is held, and the rear surface W2 of the wafer W is in an exposed state. When the chuck table 10 is moved horizontally, the wafer W is positioned just under the grinding unit 11. When the Wafer W is positioned just under the grinding unit 11, the wafer W is rotated in accordance with the rotation of the chuck table 10, and the grinding unit 11 moves down with the grinding stone 114 rotating to contact the rear surface W2 of the wafer W, thereby grinding the same so that the wafer has a predetermined thickness (grinding step).

Figure 4:
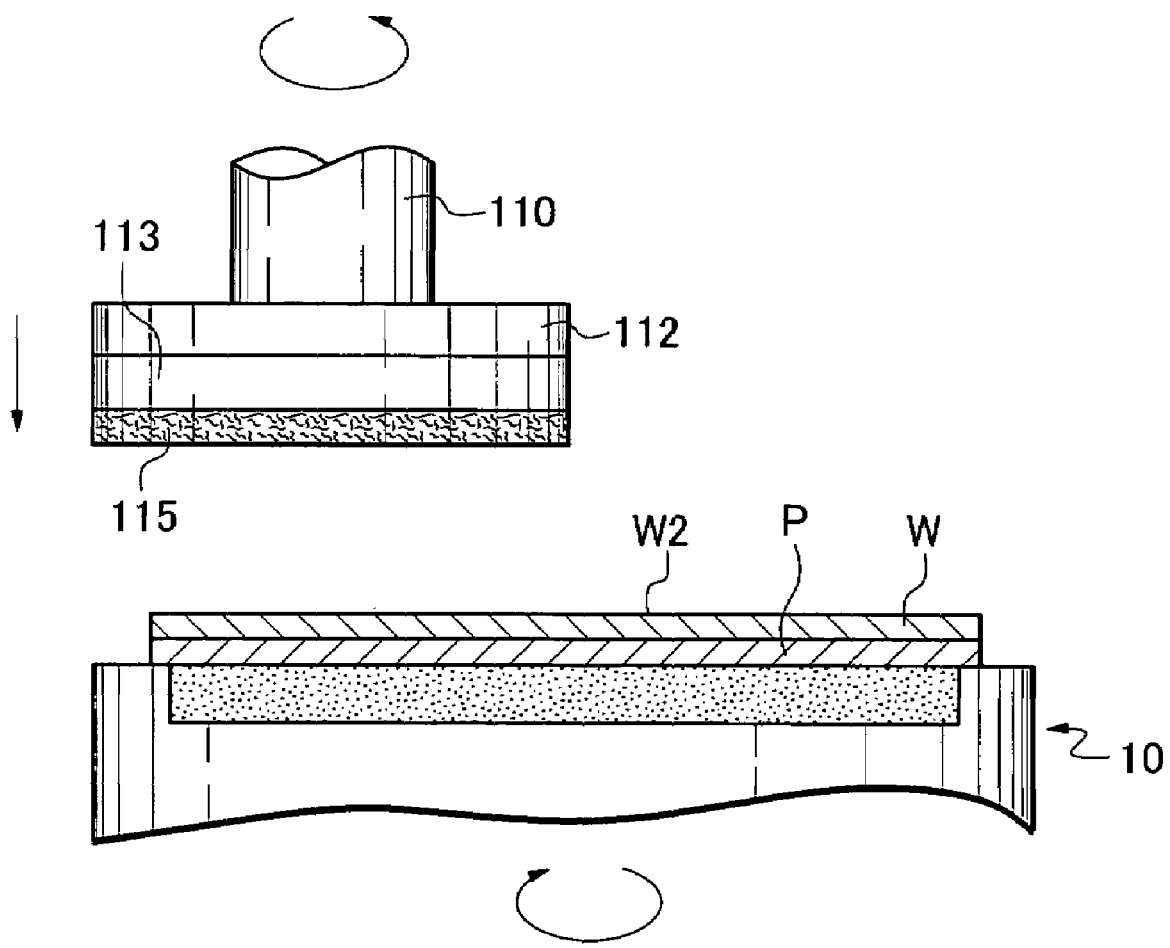
FIG. 4 is a sectional view showing an example of a stress-relieving step.

When the grinding step is carried out, a damaged layer is formed in the rear surface W2 of the wafer W due to grinding distortion to cause stress in the wafer W, which constitutes a factor of decreasing the die strength. In order to remove the damaged layer, it is desirable that a stress-relieving step be carried out after the grinding step. The stress-relieving step is carried out, as shown in FIG. 4 for example, by fixing a polishing pad 115 instead of the grinding stone 114 in the grinding apparatus 1 shown in FIG. 3, and polishing the rear surface of the wafer in the same manner as the grinding operation. The damaged layer can also be removed by dry etching or wet etching. Referring to FIG. 4, the parts other than the polishing pad 115 are designated by the reference numerals identical with those of the parts of the grinding apparatus 1 of FIG. 3.

Figure 5A:
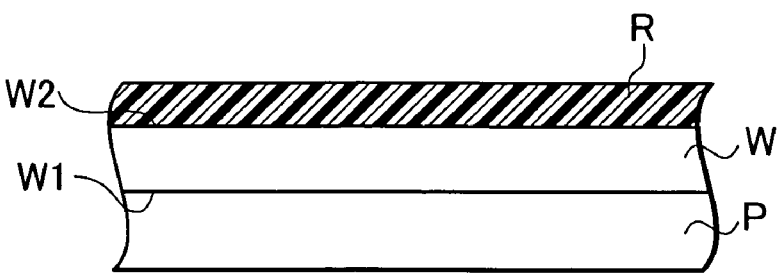

After the stress in the wafer W is removed by the stress-relieving step, whole the rear surface W2 of the wafer is coated with a resist film R by using a spin coater, or the like, as shown in FIG. 5(A). As the resist film R, for example, a novolak resin can be used.

Figure 6:
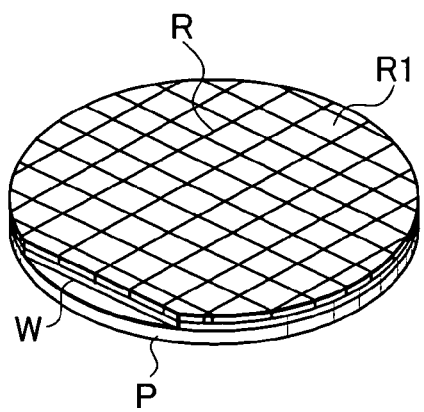
FIG. 6 is a perspective view showing a condition of the resist film a part thereof is sensitized and affected.

The streets S formed on the front surface W1 are then detected by an infrared camera, and the portions of the resist film R other than regions W2S corresponding to the streets S, are exposed and sensitized. As a result, the resist film R is divided, as shown in FIG. 6, into an unaffected resist film R on the regions W2S corresponding to the streets S and an affected layer R1 other than the unaffected resist film R (resist film-coating step).

Figure 5B:
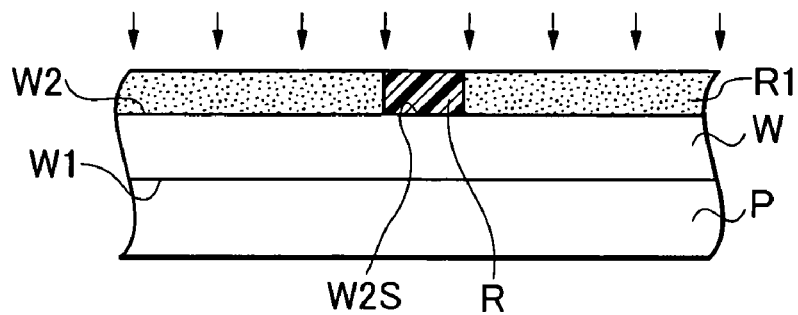
Figure 5C:
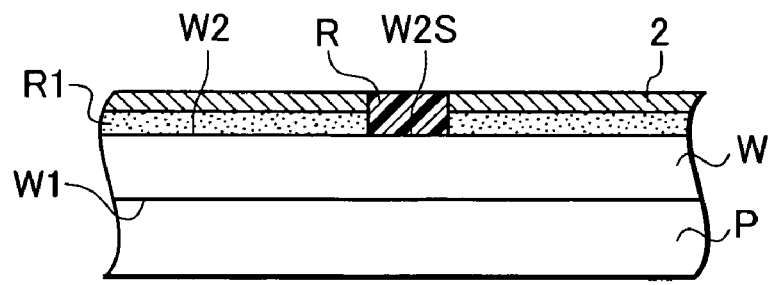

As shown in FIG. 5(B), a silylation agent such as hexamethyldisilazane and hexamethylcyclotrisilazane is supplied onto the surfaces of the resist film R and affected layer R1. Since the affected layer R1 has OH group, the OH group reacts with the silylation agent supplied, and at least the surface of the affected layer R1 is silylated to form a silylated layer 2 as shown in FIG. 5C (silylation step). Meanwhile, the reaction between the OH group and silylation agent does not progress in the non-sensitized portions of the resist film R, i.e. the portions on the upper side of the regions W2S corresponding to the streets S due to a crosslinking reaction between the OH group and a photosensitive agent, so that a silylation operation is not carried out.

Figure 5D:
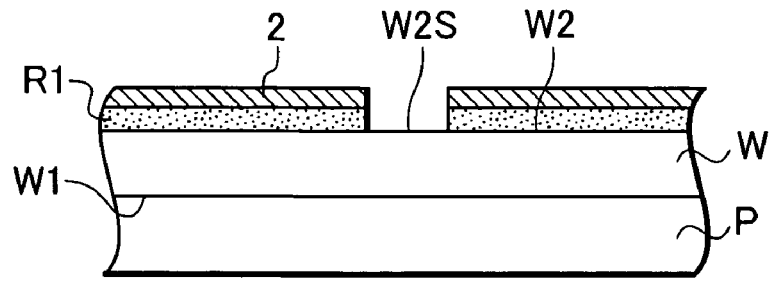
Figure 7:
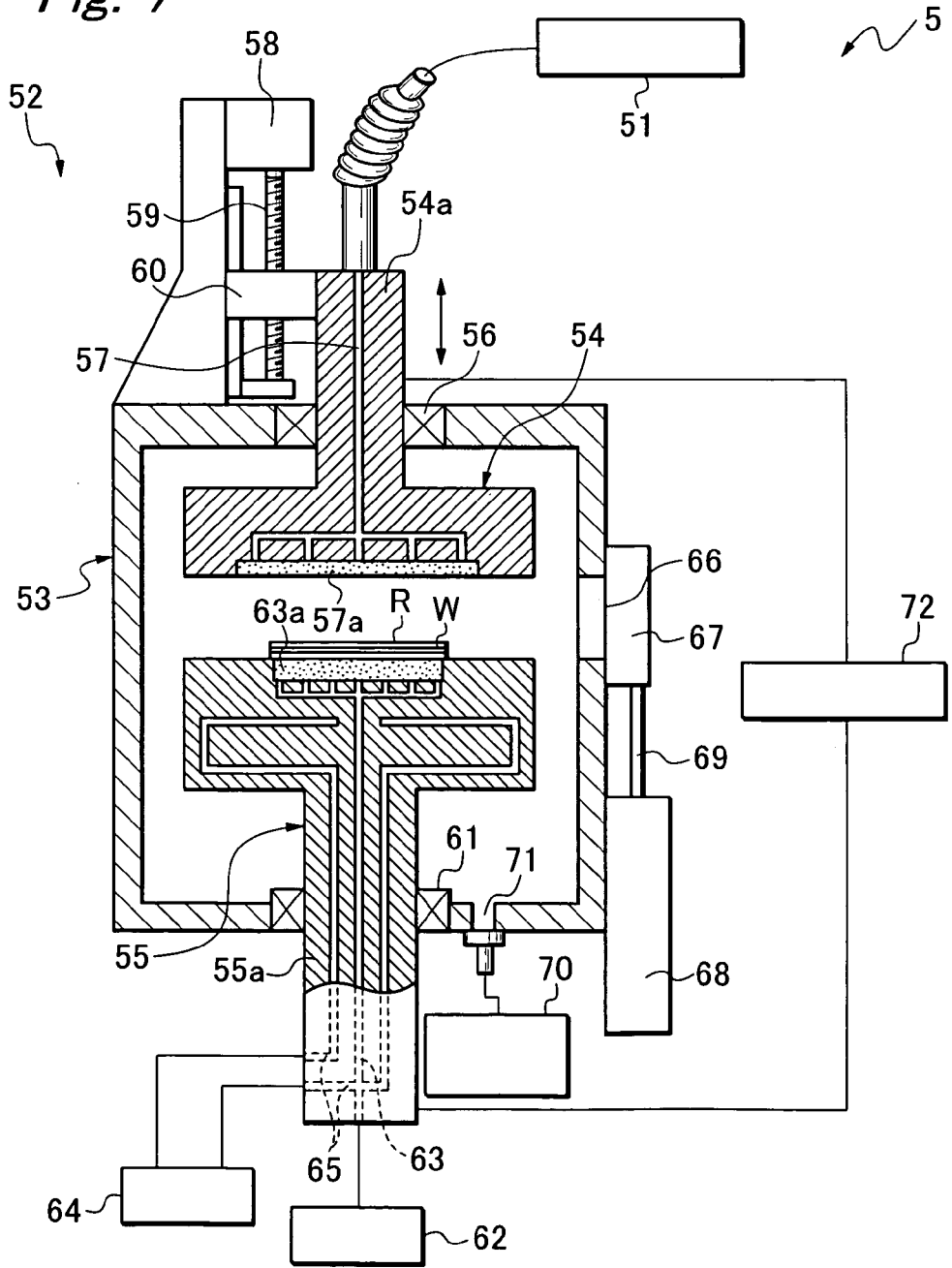
FIG. 7 is a sectional view showing an example of an etching unit.

An oxygen- or chlorine-containing gas is plasmatized and then supplied to the rear surface W2 coated with a resist film R of the wafer W by using the etching unit 5 shown in FIG. 7, for example, and an unsilylated portions of the resist film R, i.e. the resist film formed on the upper side of the regions W2S corresponding to the streets S is thereby removed as shown in FIG. 5(D).

The plasma etching unit 5 shown in FIG. 7 is provided with a gas supply member 51 and an etching processor 52. The gas supply member 51 stores therein a stable fluoride gas, i.e. a fluorine-containing stable gas such as $SF_6$, $CF_4$, $C_2F_6$, $C_2F_4$ and $CHF_3$, and an oxygen- or chlorine-containing ashing gas. In the etching processor 52, a ground workpiece W is stored, and the stable fluoride gas supplied from the gas supply member 51 is plasmatized to etch the wafer W. The etching processor also plasmatizes the ashing gas to ash the resist film.

The etching processor 52 holds the gas supply unit 54 from an upper side of a chamber 53 in which plasma etching is carried out, and holds the chuck table 55 from a lower side thereof which is adapted to hold a plate type material to be etched.

The gas supply unit 54 has a function of supplying an etching gas on the exposed surface of the wafer W supported by the chuck table 55, and a shaft portion 54a is inserted through the chamber 53 movably up and down via a bearing 56. In the interior of the gas supply unit 54, a gas flow passage 57 communicating with the gas supply member 51 and a blow-out member 57a made of a porous material are formed. The gas supply unit 54 is structured to move up and down in accordance with the up and down movements of a lift member 60 having a nut engaged with the ball screw 59 which is driven by the motor 58 and turned.

In the chuck table 55, a shaft 55a is inserted rotatably therethrough via a bearing 61. In the interior of the chuck table 55, a suction passage 63 communicating with a suction material source 62, and a cooling material passages 65 communicating with a cooler 64 are formed, and the suction passage 63 communicates with a suction portion 63a in a surface of the chuck table.

In a side portion of the chamber 53, an opening 66 constituting a carry-out and carry-in port for the plate type material to be etched is formed, and a shutter 67 is provided on an outer side of the opening 66 for opening and closing the opening 66 by up and down movements thereof. This shutter 67 is moved up and down by an operation of a piston 69 driven to move up and down by a cylinder 68.

The chamber 53 is provided at a lower portion thereof with an exhaust port 71 communicating with a gas exhaust unit 70, so that a used gas can be discharged therefrom. A high-frequency electric power source 72 is connected to the gas supply unit 54 and chuck table 55 to supply a high-frequency voltage and plasmatize the etching gas.

It will now be described the operation for removing the resist film R on the upper side of the regions W2S corresponding to the streets S by using the plasma etching unit 5 shown in FIG. 7. The wafer W on which the resist film R on the portions other than the regions W2S corresponding to the streets S is silylated to form a silylated layer 2 as shown in FIG. 5(C) advances into the interior of the chamber 53 through the opening 66 in an opened state with the shutter 67 moved down, and is held by the suction portion 63a with the rear surface W2 coated with the resist film R directed upward and exposed. The shutter 67 is then returned to the original position to dose the opening 66 and vacuum discharge the gas from the interior of the chamber 53.

The gas supply unit 54 is then lowered, and an oxygen- or chlorine-containing gas, for example, $O_2$ gas is supplied from the gas supply member 51 to the gas flow passage 57. The gas is blown out from the blowout portion 57a in the rear surface of the gas supply unit 54, the high-frequency voltage is applied from the high-frequency power source 72 to a position between the gas supply unit 54 and chuck table 55 to plasmatize the gas. As a result, an unsilylated resist film R, i.e. only the resist film on the upper side of the regions W2S corresponding to the streets S is ashed and removed, so that the regions W2S corresponding to the streets S on the rear surface W2 of the wafer W is exposed as shown in FIG. 5(D) (street-corresponding resist film-removing step).

Figure 5E:
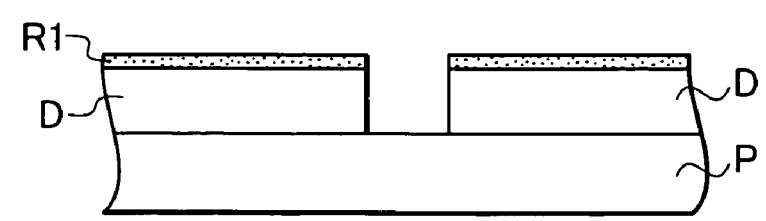
FIG. 5(E) is a condition of the streets etched.

After the ashing gas is discharged, a stable fluoride gas such as $SF_6$, $CF_4$, $C_2F_6$, $C_2F_4$ and $CHF_3$ is passed from the gas supply member 51 through the gas flow passage 57, and ejected from the blow-out portion 57a to plasmatize and etch the regions W2S corresponding to the streets S from the rear surface W2 to the front surface W1. As a result, the streets are separated into individual devices D (street-etching step) as shown in FIG. 5(E). During this time, the silylated layer 2 made of a silicon composition is also etched with the plasma and removed, and a part of the affected layer R1 is also etched.

Figure 8:
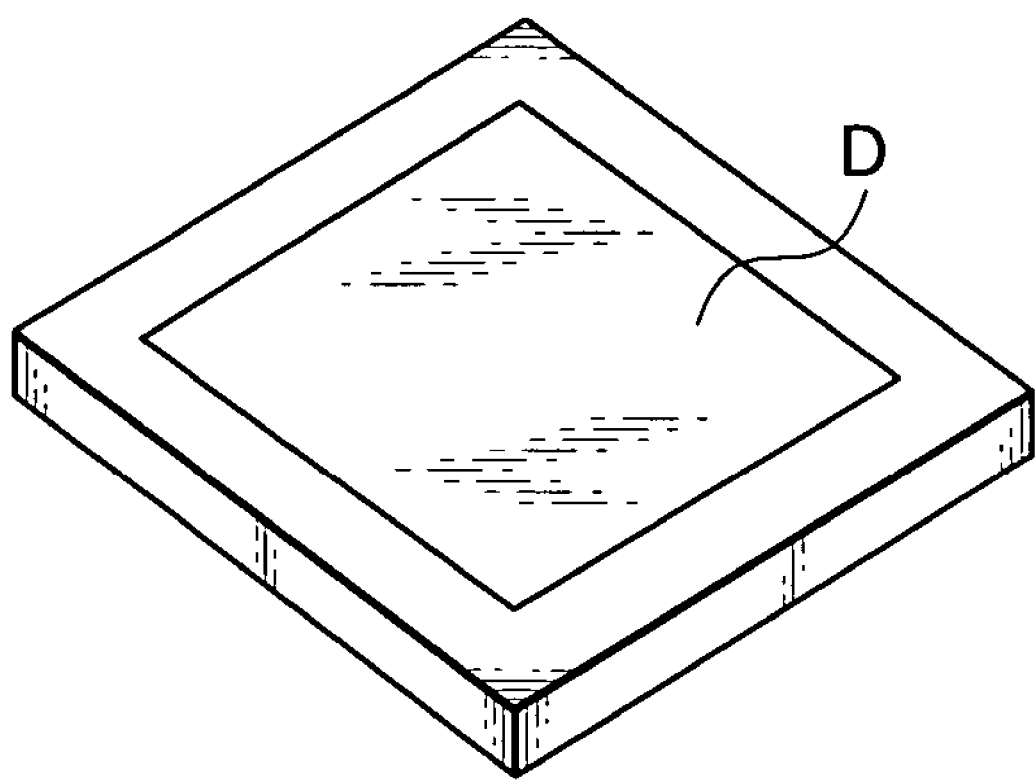
FIG. 8 is a perspective view showing an example of the device.

Finally, after the etching gas is discharged, an oxygen- or chlorine-containing gas such as an $O_2$ gas is plasmatized and supplied to the rear surface of the device D to ash and remove the affected layer R1 remaining on the rear surface of the device D. Consequently, the device D shown in FIG. 8 is obtained (resist film-removing step).

When the etching unit 5 is thus used, it is possible to remove the resist film formed on the upper side of the regions W2S corresponding to the streets S, etch the streets S and separate the same into individual devices, and remove the resist film from each device D, in the chamber 53 only by changing the kind of the gas to plasmatize. Therefore, the transferring of the wafer W is unnecessary, and necessary steps can be carried out in a smaller space. Since the cutting operation using the cutting blade is unnecessary, chipping of the devices do not occur, the die strength of the devices does not lower, and the quality of the devices does not lower. Since it is possible to separate all the streets from one another at once by a plasma etching operation, the method according to the invention is carried out very efficiently, and the productivity of the devices can be improved.

What is calimed is:

1. A wafer processing method adapted to divide a wafer a plurality of devices are formed on front surface thereof which are partitioned by streets, comprising:
    a resist film-forming step adapted to coat a rear surface of the wafer with a resist film, and expose and sensitize portions of the resist film other than regions corresponding to the streets,
    a silylation step adapted to supply a silylation agent onto a surface of the resist film and silylate the resist film in a sensitized region,
    a street-corresponding resist film-removing step, which is carried out in an etching unit for plasmatizing a predetermined gas and carrying out an etching operation with the resultant gas, adapted to plasmatize an oxygen- or chlorine-containing gas and supply the resultant gas onto the rear surface of the wafer coated with the resist film silylated by the silylation step, and ash and remove the resist film in an unsilylated region corresponding to the streets, and
    a street-etching step adapted to plasmatize a stable fluoride gas and supply the resultant gas onto the rear surface of the wafer, etch and remove the resist film in the region corresponding to the streets, and thereby divide the wafer into individual devices.

2. A wafer processing method according to claim 1, wherein a grinding step is carried out before the resist film-forming step, which is adapted to affix a protective member on the front surface of the wafer and grind the rear surface of the wafer so that the wafer has a predetermined thickness.

3. A wafer processing method according to claim 2, wherein a resist film-removing step is carried out after the street-etching step, which is adapted to plasmatize an oxygen- or chlorine-containing gas, supply the resultant gas onto the rear surfaces of the devices, and ash and remove the resist film remaining on the rear surfaces of the devices.

4. A wafer processing method according to claim 1, wherein a resist film-removing step is carried out after the street-etching step, which is adapted to plasmatize an oxygen- or chlorine-containing gas, supply the resultant gas onto the rear surfaces of the devices, and ash and remove the resist film remaining on the rear surfaces of the devices.

5. A wafer processing method according to claim 1, wherein the wafer is a silicon wafer, and the stable fluoride gas is any one of $SF_6$, $CF_4$, $C_2F_6$, $C_2F_4$ and $CHF_3$.

* * * * *